(12) United States Patent
Stapelmann et al.

(10) Patent No.: US 7,635,634 B2
(45) Date of Patent: Dec. 22, 2009

(54) DIELECTRIC APPARATUS AND ASSOCIATED METHODS

(75) Inventors: Chris Stapelmann, Tervuren (BE); Gert Jaschke, Fuerth (DE); Armin Tilke, Dresden (DE)

(73) Assignees: Infineon Technologies AG, Munich (DE); IMEC VZW, Leuven (BE)

( * ) Notice: Subject to any disclaimer, the term of this patent is extended or adjusted under 35 U.S.C. 154(b) by 197 days.

(21) Appl. No.: 11/735,607

(22) Filed: Apr. 16, 2007

(65) Prior Publication Data

US 2008/0254204 A1 Oct. 16, 2008

(51) Int. Cl.
*B05D 5/12* (2006.01)
*H01L 21/8242* (2006.01)
(52) U.S. Cl. .................. 438/365; 257/E21.001
(58) Field of Classification Search ........ 438/992, 438/758, 211, 219, 240, 257, 295, 296, 359, 438/404, 365, 482, 96, 683, 682, 33, 315; 257/304, 310, 311, 374, 501, 508, 510, 520, 257/524, E51.008, 410, 411, E21.001
See application file for complete search history.

(56) References Cited

U.S. PATENT DOCUMENTS

2001/0015453 A1* 8/2001 Agarwal ............... 257/310
2005/0110152 A1* 5/2005 Wang et al. ............ 257/760
2006/0040510 A1* 2/2006 Lee et al. ............... 438/787
2006/0199399 A1* 9/2006 Muscat .................. 438/798
2006/0228868 A1* 10/2006 Ahn et al. .............. 438/453
2006/0246737 A1* 11/2006 Yim et al. ............... 438/766
2006/0261397 A1* 11/2006 Ahn et al. .............. 257/310
2007/0037405 A1* 2/2007 Kim et al. ............... 438/758

OTHER PUBLICATIONS

D. Triyoso et al., "Impact od Deposition and Annealing Temperature on Material and Electrical Chracteristics of ALD HfO2", 2004, Journal of Electrochemical Society, vol. 151, No. 10, pp. F220-F227.*
S.A. Campbell, "The Science and Engineering of Microelectronic Fabrication", 2001, Oxford University Press, pp. 138-140.*
C. C. Finstad and A.J. Muscat, "Atomic Layer Deposition of Silicon Nitride Barrier Layer for Self-Alligned Gate Stack", 2003, Electrochemical Society Proceedings, vol. 2003-26, pp. 88-89.*

* cited by examiner

*Primary Examiner*—Thomas L Dickey
*Assistant Examiner*—Nikolay Yushin
(74) *Attorney, Agent, or Firm*—Slater & Matsil, L.L.P.

(57) ABSTRACT

In an embodiment of the invention, an amorphous phase dielectric material is selectively formed over a substrate. The amorphous phase dielectric material is then converted into a crystalline phase dielectric material.

20 Claims, 10 Drawing Sheets

DIELECTRIC APPARATUS AND ASSOCIATED METHODS

TECHNICAL FIELD

The subject matter relates generally to dielectric layers and associated methods used in connection with forming such layers.

BACKGROUND

As integrated circuits of smaller and smaller size are introduced, it becomes increasingly more difficult to scale them downwardly by shrinking the size of integrated circuit electrical components such as capacitors, while retaining their functional features. Of particular concern is the difficulty in lowering effective oxide thickness (EOT) of downwardly scaled capacitors because of the difficulties of manufacturing capacitors with exceedingly thin dielectric regions. One manner of assuring performance of capacitors in such scaled circuits is by improving the EOT by selecting dielectric materials having an increased dielectric constant.

Scalability of gate dielectric EOT is one of the greatest challenges the semiconductor community is currently facing. Continued EOT scaling is being investigated in the industry by integrating gate dielectrics with higher dielectric constants (k-value).

There is a need for dielectric materials and processes for forming them that improve the EOT of scaled capacitors.

DETAILED DESCRIPTION

The embodiments described herein are merely illustrative. Therefore, the embodiments shown should not be considered as limiting of the claims.

Various high-k dielectrics are being investigated by the industry for high-k gate stack integration, including amorphous alloys of hafnium and zirconium oxides ($HfO_2$, $ZrO_2$), incl. $HfSiO_2$, HfSiON, $ZrSiO_2$, ZrSiON and amorphous alloys of hafnium and zirconium oxides with lanthanum, aluminum, scandium, or dysprosium (for example $HfDyO_2$, $ZrScO_2$, HfLaO) or scandium/dysprosium oxides (for example $ScDyO_2$). Amorphous phases of these materials are preferred since they are more easily etched which facilitates integration of the so called high-k materials. Silicon oxynitride (SiON) is the current dielectric of choice for CMOS applications. SiON is reaching its scalability limits, however, and lower EOT values can only be reached by increasing the dielectric constant k. SiON has a k-value of from 7-8. The other dielectrics mentioned above have k-values between 15 and 25. In one or more embodiments of the invention, the high-k dielectric materials may have a dielectric constant which is greater than that of silicon dioxide. In one or more embodiments of the invention, the high-k dielectric materials may have a dielectric constant which is greater than about 3.9.

In CMOS applications, it is known that the use of high-k gate dielectrics in combination with the standard poly-silicon gate electrodes leads to Fermi-Level Pinning (FLP) at the high-k/poly-silicon interface. FLP causes undesirably high threshold voltages of the device which makes the device unusable for most CMOS applications. One solution to this problem is to use metal electrodes consisting of formed metals or fully silicided poly-silicon (FUSI), which significantly reduce FLP. One drawback of metal and FUSI gates is that they are sensitive to high temperature treatments.

Various embodiments described herein reduce the thermal budget on a gate electrode and can, for example, be used in a gate last or replacement gate CMOS flow in which a gate stack formation takes place after high temperature source/drain anneals. According to various embodiments, a source/drain anneal and a high-k transformation are combined.

It has recently been discovered that crystalline phase hafnium silicon oxide ($HfSiO_2$), particularly in the tetragonal or cubic phase, has a k-value of approximately 40, which, if used as a dielectric for a scaled integrated circuit capacitor, would enable effective oxide thickness (EOT) scalability for several further generations of reduced scale architecture.

A drawback of crystalline phase $HfSiO_2$ is that it is not readily etched, let alone selectively etched, which makes standard integration of this material, into existing processes, very difficult. Various embodiments described herein include an integration scheme of area masking, a selective formation process to form $HfSiO_2$ in selected areas, and a thermal treatment to avoid the difficulties encountered in etching a formed, very high-k, crystalline phase $HfSiO_2$ material.

FIGS. 1A-1H illustrate cross-sections of an integrated circuit device 100 that is fabricated according to various embodiments. FIG. 2 illustrates a flow diagram of several methods associated with FIGS. 1A-1H according to various embodiments.

FIGS. 1A-1E illustrate the use of lithography to remove a silicon dioxide ($SiO_2$ or oxide) layer from areas of a silicon substrate on which $HfSiO_2$ should not be formed, and to expose silicon (Si) in those areas. In block 210, the methods start.

Figure 1A:
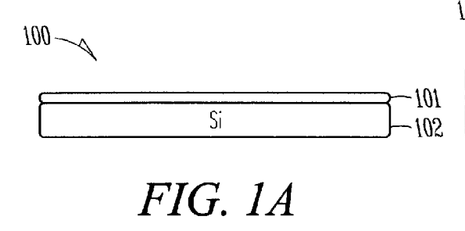
FIGS. 1A-1H illustrate cross-sections of an integrated circuit device that is fabricated according to various embodiments.
Figure 2:
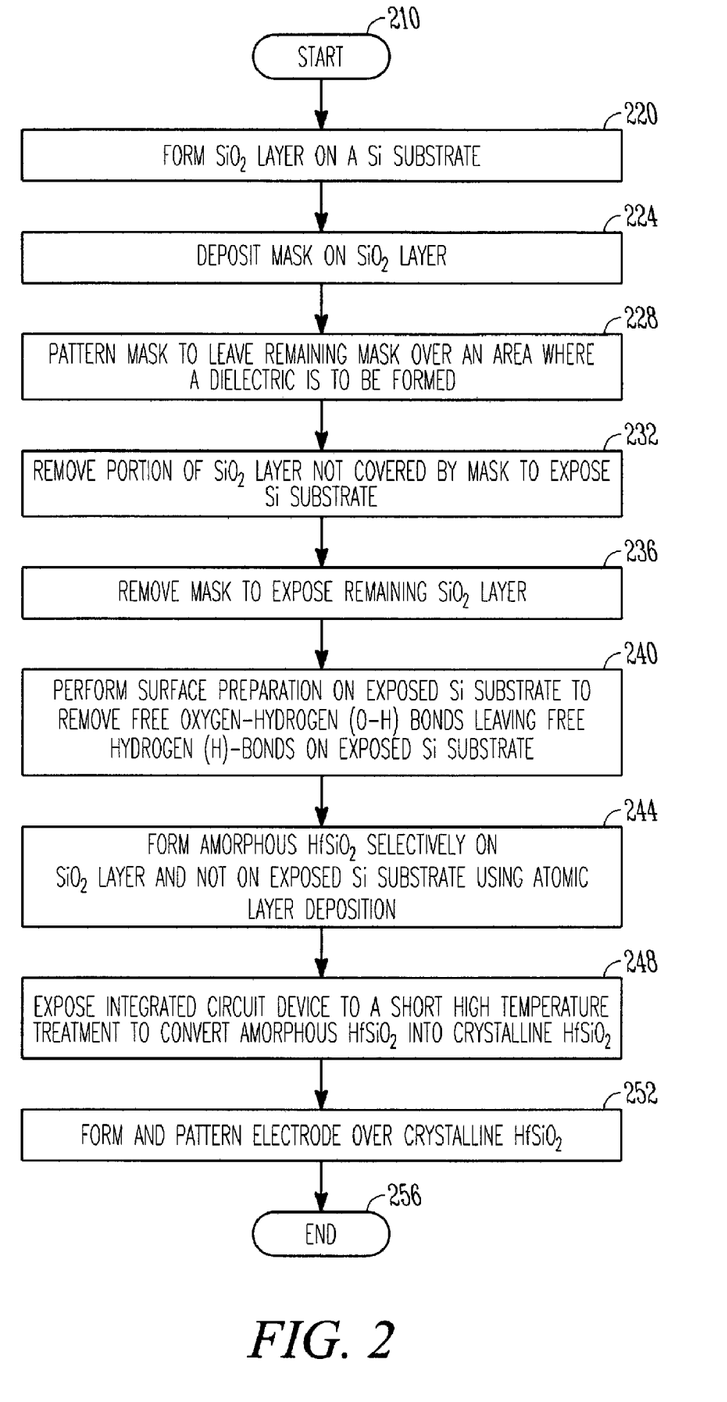
FIG. 2 illustrates a flow diagram of several methods associated with FIGS. 1A-1H according to various embodiments.

In FIG. 1A and block 220, a $SiO_2$ layer 101 is formed on a Si substrate 102.

Figure 1B:
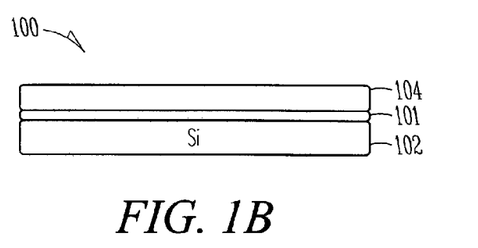

In FIG. 1B and block 224, a mask 104 is formed on the $SiO_2$ layer 101.

Figure 1C:
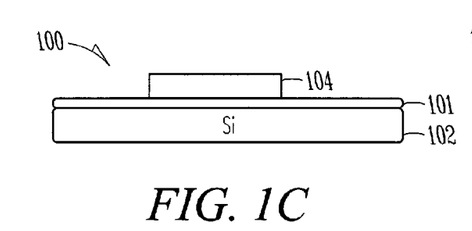

In FIG. 1C and block 228, the mask 104 is patterned to leave the remaining mask 104 over an area where a dielectric is to be formed.

Figure 1D:
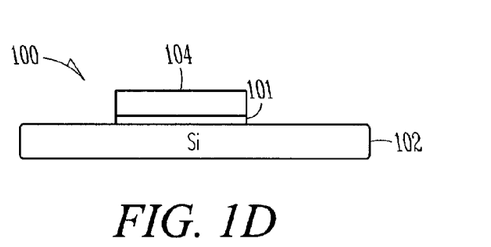

In FIG. 1D and block 232, a portion of the $SiO_2$ layer 101 that is not covered by the mask 104 is removed to expose the Si substrate 102.

Figure 1E:
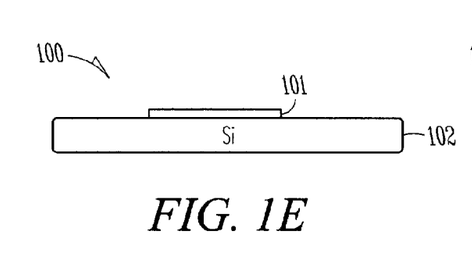

In FIG. 1E and block 236, the mask 104 is removed to expose the remaining $SiO_2$ layer 101. The remaining $SiO_2$ layer 101 is sufficiently thick to allow the selective formation of a high-k dielectric, at the same time it is thin enough not to significantly increase the EOT of a gate stack, for example 1-5 atomic layers.

In block 240, the exposed Si substrate 102 undergoes a surface preparation to remove free oxygen-hydrogen (O—H) bonds, leaving free hydrogen (H)-bonds on the exposed Si substrate 102. An ammonia based chemistry like SC1 ($NH4OH/H_2O_2$) can be used for this purpose.

Figure 1F:
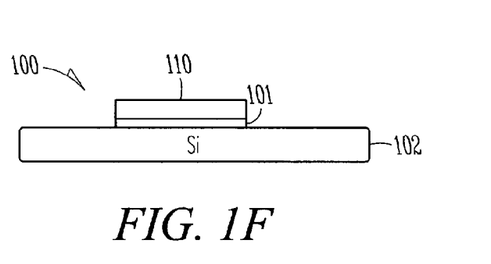

In FIG. 1F and block 244, a process regime of atomic layer formation (ALD) is used to form amorphous $HfSiO_2$ 110 selectively on the $SiO_2$ layer 101 and not on the exposed Si substrate 102.

Under certain process conditions for the ALD formation, it is possible to selectively form dielectric layers on O—H terminated surfaces only, while formation on H-terminated surfaces is suppressed. By removing the free O—H bonds from the Si substrate 102, it is possible to selectively form the dielectric layer on the $SiO_2$ layer 101, where linear formation is achieved on the O—H bonds. This mechanism has been shown for chlorine and amino containing pre-cursors such as HfCl.

An exemplary suitable process regime for selective ALD formation lies between a pedestal temperature of 200-400 degrees Celsius, a pressure range between 0.1 Torr-4 Torr, and a pre-cursor flow of 200-1000 sccm. Layer formation is also influenced by the pre-cursor temperature, which can be between 20 degrees Celsius and 250 degrees Celsius depending of the vapour pressure of the pre-cursor.

A chlorine (Cl)-based precursor is used for the ALD formation such as Hafnium Chloride (HfCl). The Hafnium Chloride (HfCl) pre-cursor will not react to the free H-bonds on the silicon surface, but rather reacts with the O—H bonds on the surface of the $SiO_2$ layer 101. After a certain amount of water ($H_2O$) pulses during the formation process, O—H bonds may be created on the surface of the Si substrate 102 and $HfSiO_2$ may begin to slowly form there, but a desired thickness of $HfSiO_2$ for a dielectric should be achieved before this mechanism sets in. Alternatively to chloride based pre-cursors like HfCl, amino based pre-cursors can also be used for a selective formation of suitable high-k dielectrics. Alternatively, a corresponding selective CVD or epitaxial process can be used to form a high-k dielectric.

Figure 1G:
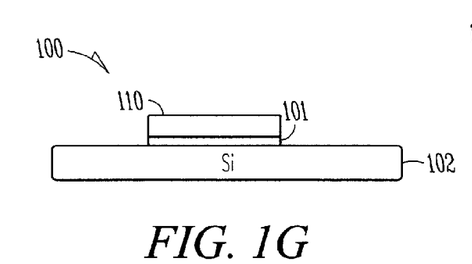

In FIG. 1G and block 248, the integrated circuit device 100 is exposed to a short high temperature treatment to convert the amorphous $HfSiO_2$ 110 into crystalline $HfSiO_2$ 110. The high temperature treatment could be performed right after the formation of $HfSiO_2$ 110 or at a later point according to various embodiments. According to various embodiments, the amorphous $HfSiO_2$ 110, the $SiO_2$ layer 101, and the Si substrate 102 are exposed to a temperature of 1050 degrees Celsius for one second to convert the amorphous $HfSiO_2$ 110 into crystalline $HfSiO_2$ 110.

According to various embodiments, several methods of high temperature treatments can be employed to convert amorphous dielectric materials into the desired high-k value crystalline phases. Examples of suitable methods include rapid thermal annealing (RTP), Spike annealing, and Flash annealing. The duration and temperature of the heat treatment depend on the material composition and layer thickness. For example, for $HfO_2$, a 600 degree Celsius anneal at 1 minute would suffice. Higher temperatures and shorter times are also feasible. The anneal should be performed in an inert ambient such as $N_2$, $H_2$, or Ar, where different ambient gases will display different heat transfer behaviour. In general, a slow crystallization will lead to large crystals and a fast crystallization will lead to small crystals.

Figure 1H:
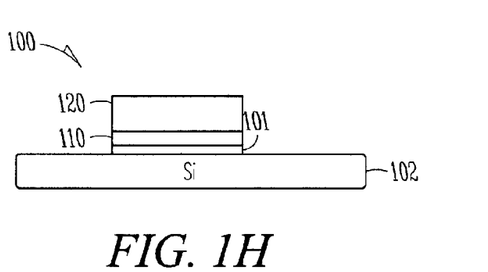

In FIG. 1H and block 252, an electrode layer 120 is formed and patterned over the crystalline $HfSiO_2$ 110. In block 256, the methods end.

FIGS. 3A-3G illustrate cross-sections of an integrated circuit device 300 that is fabricated according to various embodiments. FIG. 4 illustrates a flow diagram of several methods associated with FIGS. 3A-3G according to various embodiments. FIGS. 3A-3G illustrate the use of a mask to which an $HfSiO_2$ formation process is selective. According to various embodiments, the mask may be silicon carbide (SiC), silicon oxynitride (SiON), or silicon nitride ($Si_3N_4$). According to these embodiments, the entire gate stack can be formed without having to remove a mask and the gate stack is better aligned. No additional photomasks are required. In block 410, the methods start.

Figure 3A:
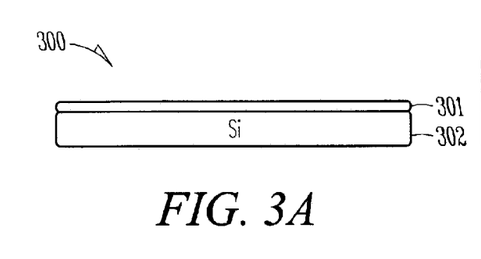
FIGS. 3A-3G illustrate cross-sections of an integrated circuit device that is fabricated according to various embodiments.
Figure 4:
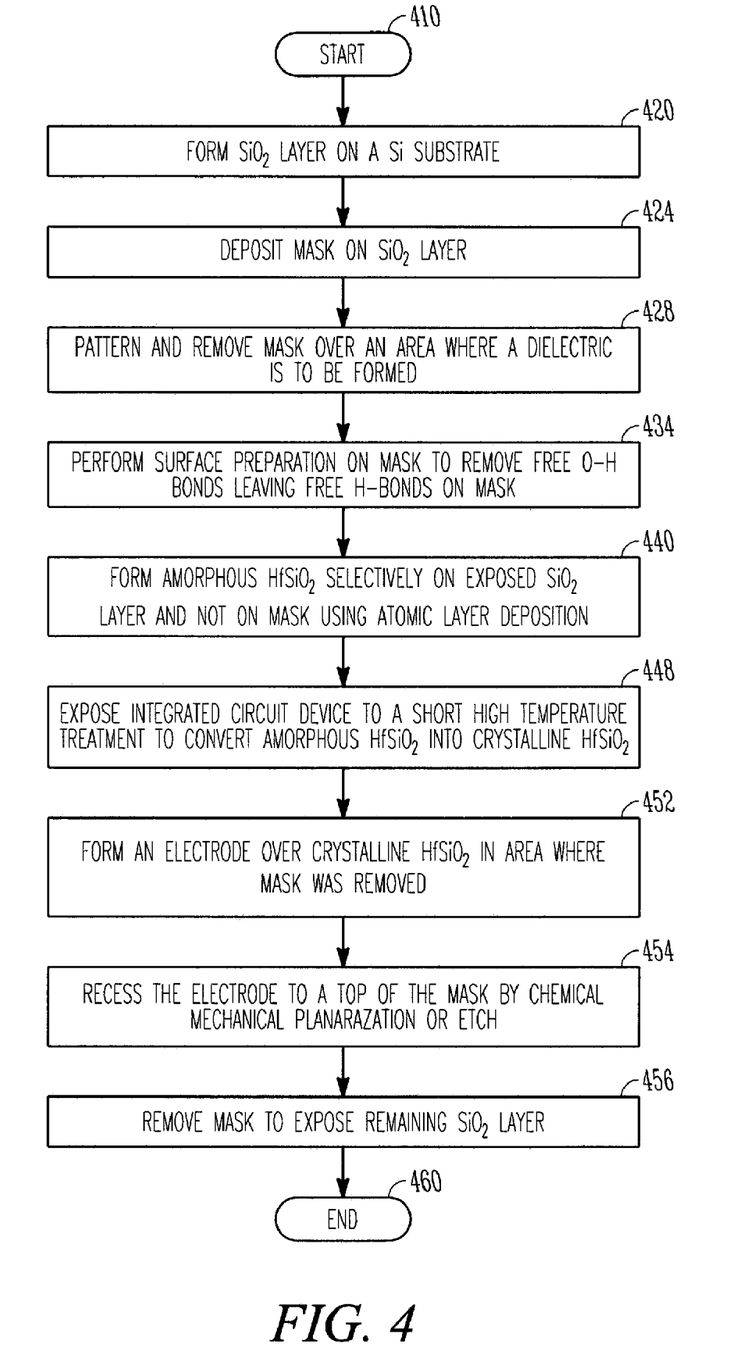
FIG. 4 illustrates a flow diagram of several methods associated with FIGS. 3A-3G according to various embodiments.

In FIG. 3A and block 420, a silicon dioxide ($SiO_2$ or oxide) layer 301 is formed on a Si substrate 302.

Figure 3B:
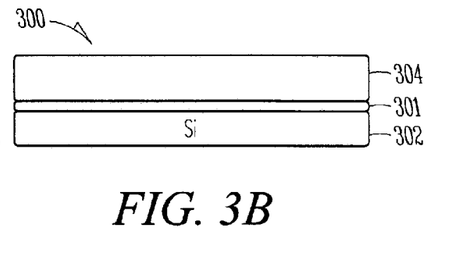

In FIG. 3B and block 424, a mask 304 is formed on the $SiO_2$ layer 301. The mask 304 is of a material to which an $HfSiO_2$ formation process is selective. According to various embodiments, the mask 304 is SiC, $Si_3N_4$, or SiON.

Figure 3C:
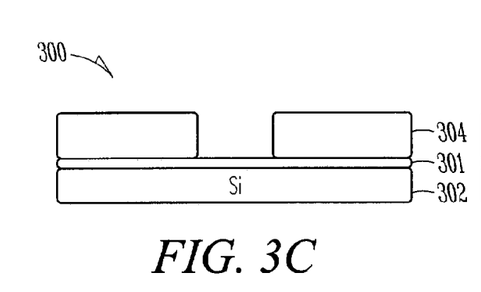

In FIG. 3C and block 428, the mask 304 is patterned and removed over an area where a dielectric is to be formed. The mask 304 remains over the rest of the $SiO_2$ layer 301.

In block 434, the mask 304 undergoes a surface preparation to remove free O—H bonds leaving free H-bonds on the mask 304.

Figure 3D:
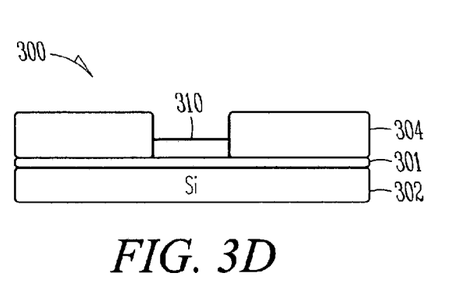

In FIG. 3D and block 440, a process regime of ALD is used to form amorphous $HfSiO_2$ 310 selectively on the exposed $SiO_2$ layer 301 and not on the mask 304. A chlorine (Cl)-based precursor is used for the ALD process such as Hafnium Chloride (HfCl). The Hf will not bond to the free H-bonds, but rather bonds to the surface of the $SiO_2$ layer 301. After a certain amount of $H_2O$ pulses during the formation process, O—H bonds may be created on the surface of the mask 304 and HfSiO2 may begin to slowly form there, but a desired thickness of $HfSiO_2$ for a dielectric should be achieved before this mechanism sets in.

Figure 3E:
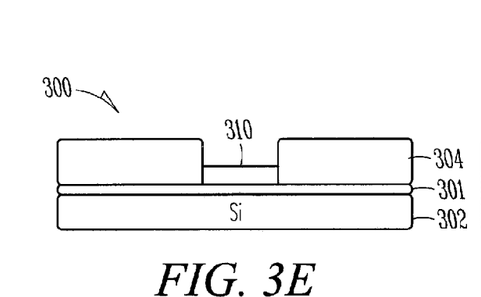

In FIG. 3E and block 448, the integrated circuit device 300 is exposed to a short high temperature treatment to convert the amorphous $HfSiO_2$ 310 into crystalline $HfSiO_2$ 310. The high temperature treatment could be performed right after the formation of $HfSiO_2$ 310 or at a later point according to various embodiments. According to various embodiments, the amorphous $HfSiO_2$ 310, the $SiO_2$ layer 301, and the Si substrate 302 are exposed to a temperature of about 1050 degrees Celsius for about one second to convert the amorphous $HfSiO_2$ 310 into crystalline $HfSiO_2$ 310.

Figure 3F:
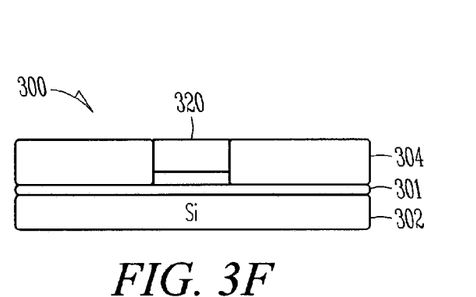

In FIG. 3F and block 452, an electrode layer 320 is formed over the crystalline $HfSiO_2$ 310 in the area where the mask 304 was removed.

In block 454, part of the electrode layer 320 may need to be removed from the top of the mask 304 using a recess step. The electrode layer 320 is recessed to a top of the mask 304. This can be done by at least one of a chemical mechanical planarization (CMP), a wet etch, and a dry etch step.

Figure 3G:
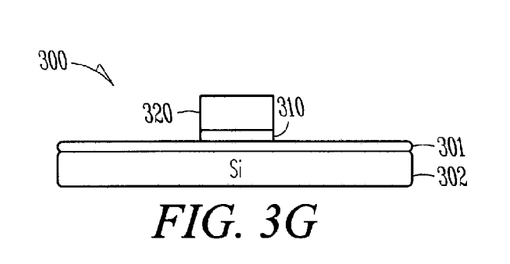

In FIG. 3G and block 456, the mask 304 is removed to expose the remaining $SiO_2$ layer 301. According to various embodiments, the remaining $SiO_2$ layer 301 that is not under the electrode layer 320 may be removed (not shown) using at least one of a dry etch or a wet etch (for example HF based). In block 460, the methods end.

FIGS. 5A-5H illustrate cross-sections of an integrated circuit device 500 that is fabricated according to various embodiments. FIG. 6 illustrates a flow diagram of several methods associated with FIGS. 5A-5G according to various embodiments. FIGS. 5A-5G illustrate the use of a mask to which an $HfSiO_2$ formation process is selective. The mask may be silicon carbide (SiC), silicon oxynitride (SiON), or silicon nitride ($Si_3N_4$) according to various embodiments. According to these embodiments, the entire gate stack can be formed without having to remove a mask and the gate stack is better aligned. No additional photomasks are required. In block 610, the methods start.

Figure 5A:
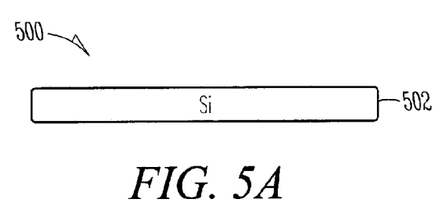
FIGS. 5A-5H illustrate cross-sections of an integrated circuit device that is fabricated according to various embodiments.
Figure 6:
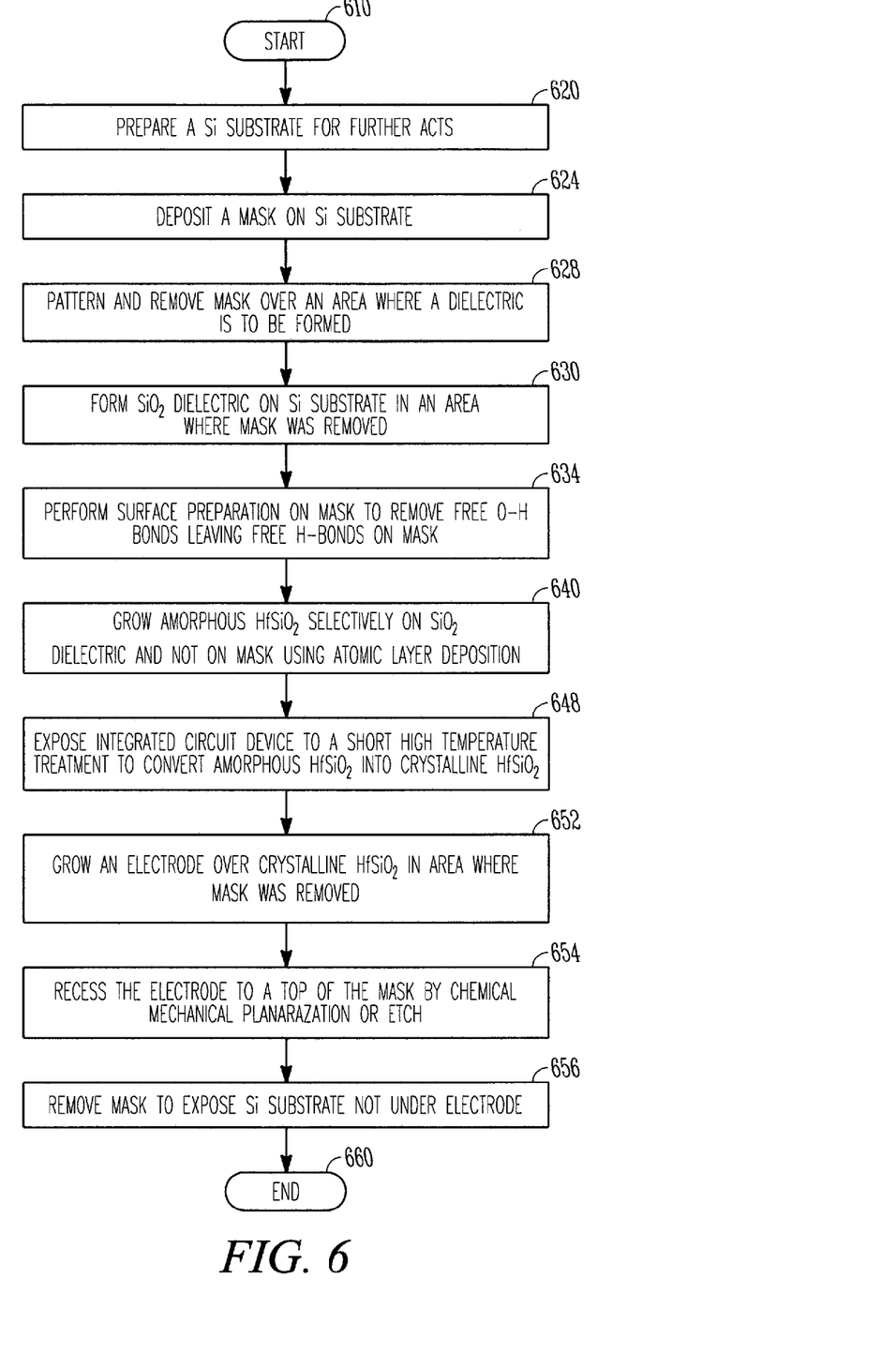
FIG. 6 illustrates a flow diagram of several methods associated with FIGS. 5A-5H according to various embodiments.

In FIG. 5A and block 620, a Si substrate 502 is prepared for further acts.

Figure 5B:
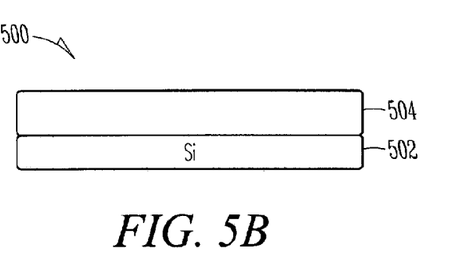

In FIG. 5B and block 624, a mask 504 is formed on the Si substrate 502. The mask 504 is of a material to which an $HfSiO_2$ formation process is selective. According to various embodiments, the mask 504 is SiC, $Si_3N_4$, or SiON.

Figure 5C:
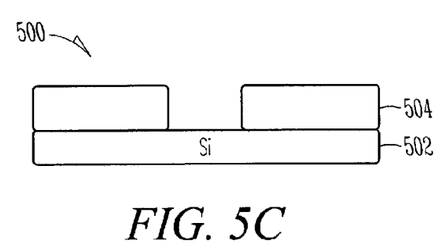

In FIG. 5C and block 628, the mask 504 is patterned and removed over an area where a dielectric is to be formed. The mask 504 remains over the rest of the Si substrate 502.

Figure 5D:
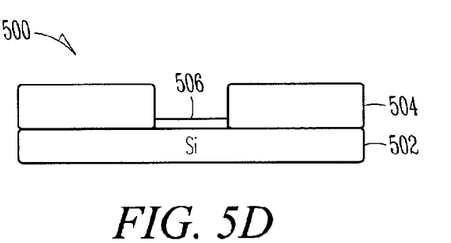

In FIG. 5D and block 630, a silicon dioxide ($SiO_2$ or oxide) dielectric 506 is formed on the Si substrate 502 in an area where the mask 504 was removed. According to various embodiments, the $SiO_2$ dielectric 506 is formed by selective oxidation of the Si substrate 502. This can for example be achieved by either a thermal or chemical oxidation. Examples of a thermal oxidation include annealing in an oxidizing ambient like $O_2$ or $O_3$ (ozone) at temperatures between 600-900 degrees Celsius for 10-60 minutes depending on the desired oxide thickness. Chemical oxidation can be achieved using a liquid $H_2O$/ozone mixture or piranha chemistry using sulphuric acid with either ozone or hydrogen peroxide ($H_2SO_4/O_3$ or $H_2SO_4/H_2O_2$).

In block 634, the mask 504 undergoes a surface preparation to remove free O—H bonds leaving free H-bonds on the mask 504.

Figure 5E:
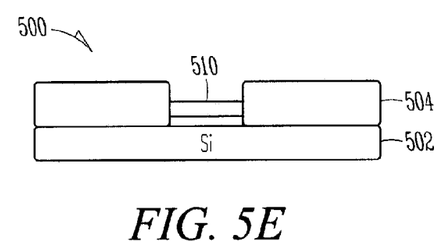

In FIG. 5E and block 640, a process regime of ALD is used to form amorphous $HfSiO_2$ 510 selectively on the $SiO_2$ dielectric 506 and not on the mask 504. A chlorine (Cl)-based precursor is used for the ALD formation such as Hafnium Chloride (HfCl). The Hf will not bond to the free H-bonds, but rather bonds to the surface of the $SiO_2$ dielectric 506. After a certain amount of H2O pulses during the formation process, O—H bonds may be created on the surface of the mask 504 and $HfSiO_2$ may begin to slowly form there, but a desired thickness of $HfSiO_2$ for a dielectric should be achieved before this mechanism sets in.

Figure 5F:
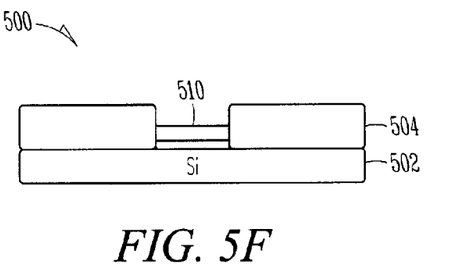

In FIG. 5F and block 648, the integrated circuit device 500 is exposed to a short high temperature treatment to convert the amorphous $HfSiO_2$ 510 into crystalline $HfSiO_2$ 510. The high temperature treatment could be performed right after the formation of $HfSiO_2$ 510 or at a later point according to various embodiments. According to various embodiments, the amorphous $HfSiO_2$ 510, the $SiO_2$ dielectric 506, and the Si substrate 502 are exposed to a temperature of 1050 degrees Celsius for one second to convert the amorphous $HfSiO_2$ 510 into crystalline $HfSiO_2$ 510.

Figure 5G:
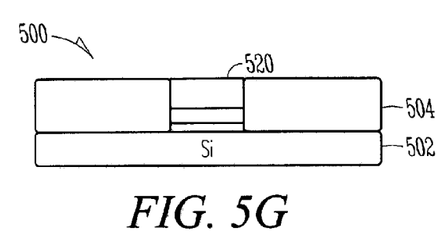

In FIG. 5G and block 652, an electrode layer 520 is formed over the crystalline $HfSiO_2$ 510 in the area where the mask 504 was removed.

In block 654, part of the electrode layer 520 may need to be removed from the top of the mask 504 using a recess step. The electrode layer 520 is recessed to a top of the mask 504. This can be done by at least one of a chemical mechanical planarization (CMP), a wet etch, and a dry etch step.

Figure 5H:
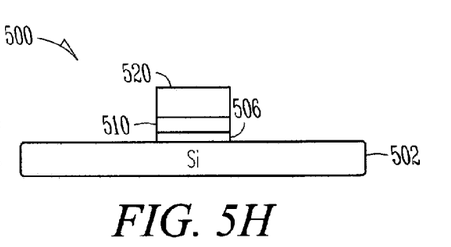

In FIG. 5H and block 656, the mask 504 is removed to expose the Si substrate 502 not under the electrode layer 520. In block 660, the methods end.

FIGS. 7A-7J illustrate cross-sections of an integrated circuit device 700 that is fabricated according to various embodiments. FIG. 8 illustrates a flow diagram of several methods associated with FIGS. 7A-7J according to various embodiments. FIGS. 7A-7J illustrate the use of a first dielectric layer to which an $HfSiO_2$ formation process is selective. In block 810, the methods start. This first dielectric layer could be silicon carbide (SiC), silicon oxynitride (SiON), or silicon nitride ($Si_3N_4$).

Figure 7A:
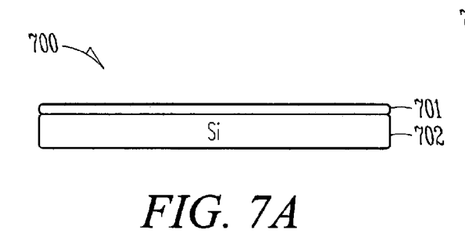
FIGS. 7A-7J illustrate cross-sections of an integrated circuit device that is fabricated according to various embodiments.
Figure 8:
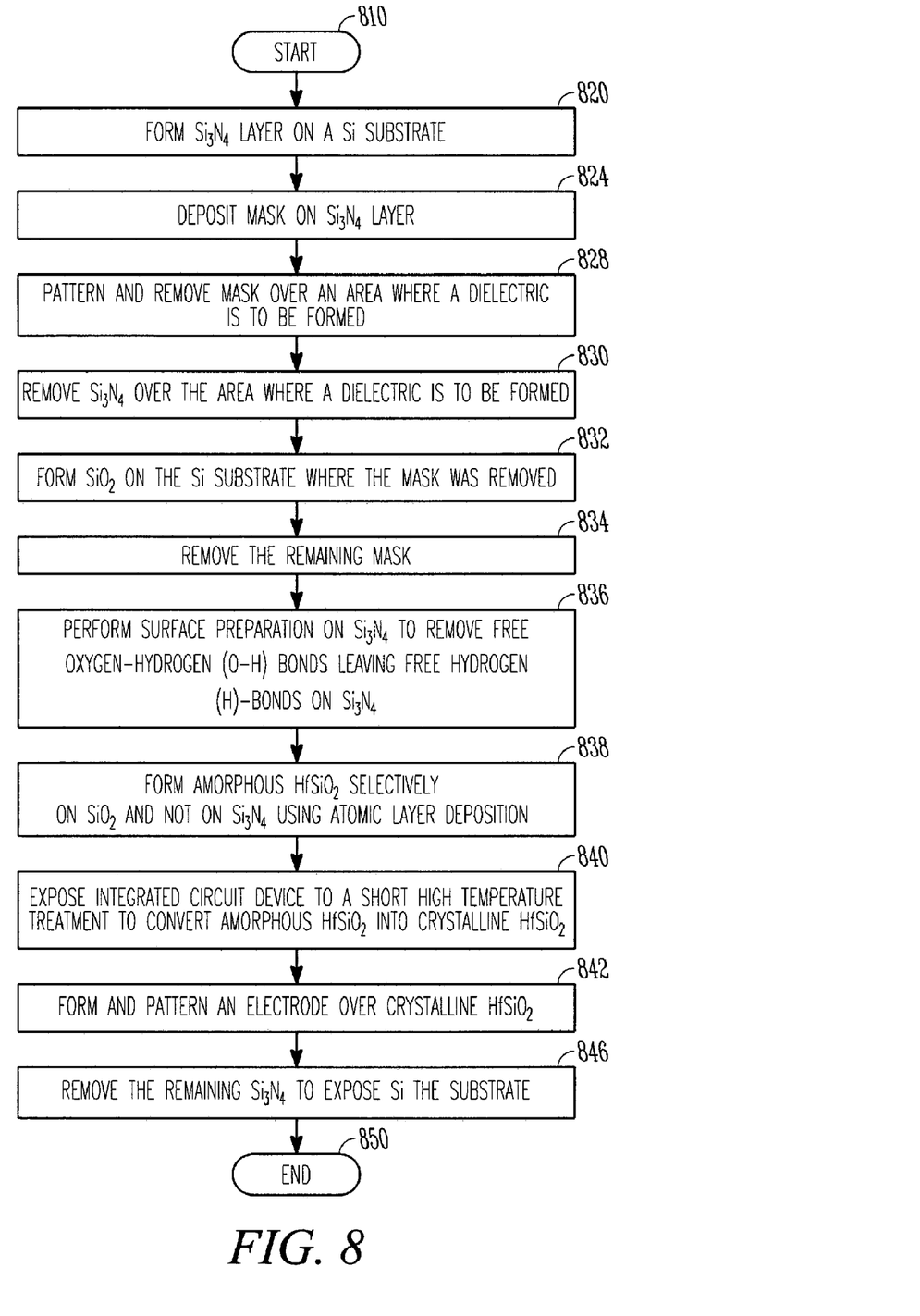
FIG. 8 illustrates a flow diagram of several methods associated with FIGS. 7A-7J according to various embodiments.

In FIG. 7A and block 820, a first dielectric layer 701 is formed on a Si substrate 702.

Figure 7B:
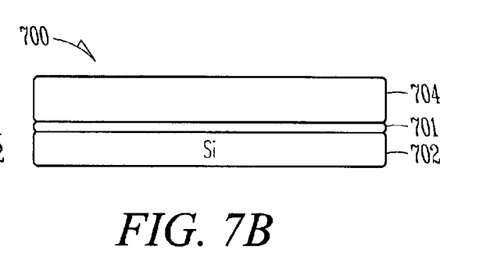

In FIG. 7B and block 824, a mask 704 is formed on the first dielectric layer 701. According to various embodiments, the mask 704 is SiC, $Si_3N_4$, or SiON, but needs to be of different material than the first dielectric layer.

Figure 7C:
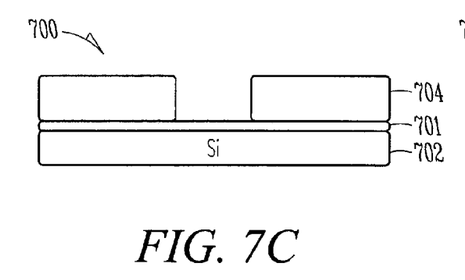

In FIG. 7C and block 828, the mask 704 is patterned and removed over an area where a dielectric is to be formed. The mask 704 remains over the rest of the first dielectric layer 701.

Figure 7D:
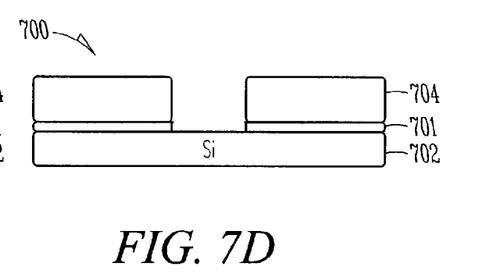

In FIG. 7D and block 830, the first dielectric layer 701 is removed over the area where a dielectric is to be formed.

Figure 7E:
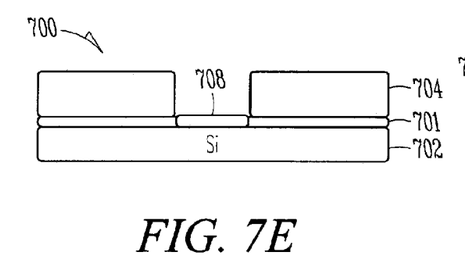

In FIG. 7E and block 832, $SiO_2$ 708 is formed on the Si substrate 702 in the area where the mask 704 was removed.

Figure 7F:
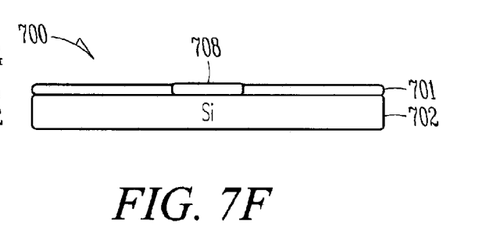

In FIG. 7F and block 834, the remaining mask 704 is removed.

In block 836, the first dielectric layer 701 undergoes a surface preparation to remove free O—H bonds leaving free H-bonds on the first dielectric layer 701.

Figure 7G:
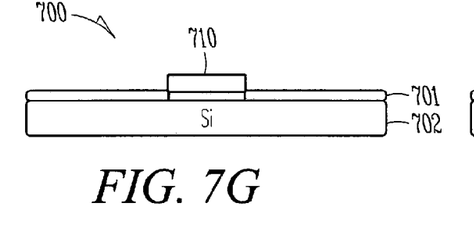

In FIG. 7G and block 838, a process regime of ALD is used to form amorphous $HfSiO_2$ 710 selectively on the $SiO_2$ 708 and not on the first dielectric layer 701. A chlorine (Cl)-based precursor is used for the ALD formation such as Haffium Chloride (HfCl). The Hf will not bond to the free H-bonds, but rather bonds to the surface of the $SiO_2$ 708. After a certain amount of $H_2O$ pulses during the formation process, O—H bonds may be created on the surface of the first dielectric layer 701 and HfSiO2 may begin to slowly form there, but a desired thickness of $HfSiO_2$ for a dielectric should be achieved before this mechanism sets in.

Figure 7H:
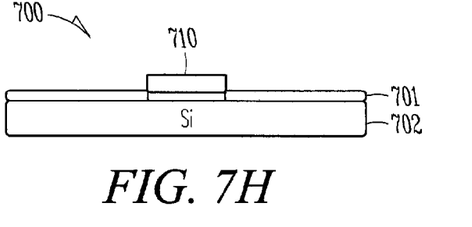

In FIG. 7H and block 840, the integrated circuit device 700 is exposed to a short high temperature treatment to convert the amorphous $HfSiO_2$ 710 into crystalline $HfSiO_2$ 710. The high temperature treatment could be performed right after the formation of $HfSiO_2$ 710 or at a later point according to various embodiments. According to various embodiments, the amorphous $HfSiO_2$ 710, the first dielectric layer 701, the $SiO_2$ 708, and the Si substrate 702 are exposed to a temperature of about 1050 degrees Celsius for about one second to convert the amorphous $HfSiO_2$ 710 into crystalline $HfSiO_2$ 710.

Figure 7I:
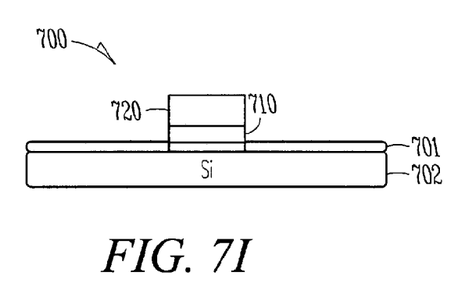

In FIG. 7I and block 842, an electrode layer 120 is formed and patterned over the crystalline $HfSiO_2$ 110.

Figure 7J:
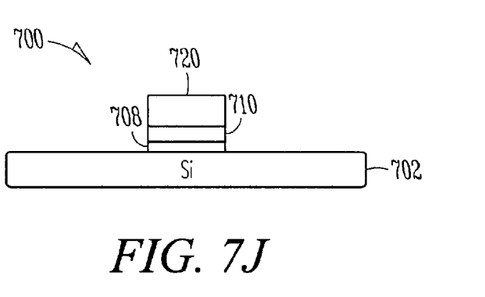

In FIG. 7J and block 846, the remaining first dielectric layer 701 is removed to expose the Si substrate 702. In block 850, the methods end.

According to various embodiments, the electrode layers 120, 320, 520, 720 may be formed of polysilicon, pure metal, a combination of two metals, a fully silicided polysilicon, metal and polysilicon, or metal and silicide, in any combination.

A Cl-based precursor is used for the ALD formation to achieve the desired selective formation pattern according to the embodiments described above. Alternatively, other high-k materials can be considered that have a very high-k crystalline phase and can be formed selectively by ALD formation with Cl-based precursors. The precursor may be zirconium chloride (ZrCl) or aluminum chloride (AlCl) according to various embodiments. According to various embodiments, crystalline HfSiO$_2$ is selectively formed on the SiO$_2$ layer 101.

According to various embodiments, chemical vapour formation (CVD), metal organic chemical vapour formation (MOCVD), or epitaxial CVD (epi) are used to form amorphous HfSiO$_2$ selectively rather than ALD.

According to various embodiments, crystalline HfSiO$_2$ is formed selectively over a Si substrate to form a dielectric.

In the various embodiments described above, a short high temperature treatment is used to convert an amorphous HfSiO$_2$ into a crystalline HfSiO$_2$. According to various embodiments, the amorphous HfSiO$_2$ is converted into a crystalline HfSiO$_2$ by a source/drain junction anneal of a silicon substrate that activates junction impurities at the same time. The crystalline HfSiO$_2$ may be in a cubic crystalline phase or a tetragonal crystalline phase.

According to various embodiments, the HfSiO$_2$ described in embodiments herein can be replaced by an amorphous phase dielectric material including one or more of hafnium (HF), zirconium (Zr), aluminum (Al), scandium (SC), dysprosium (Dy), gadolinium (Gd), lanthanum (La), oxygen (O), and nitrogen (N), in any combination. According to various embodiments, the HfSiO$_2$ described in embodiments herein can be replaced by an amorphous phase dielectric material including a material such as HfO$_2$, HfSiO$_2$, HfSiON, ZrO$_2$, ZrSiO$_2$, HfZrO$_2$, HfZrSiO$_2$, ZrSiON, LaAlO, HfDyO$_2$, and HfScO$_2$.

According to various embodiments, a Si substrate undergoes a surface preparation to leave dangling hydrogen (H)-bonds on the Si substrate. Amorphous HfSiO$_2$ may then be selectively formed on a SiO$_2$ layer with O—H bonds.

Figure 9:
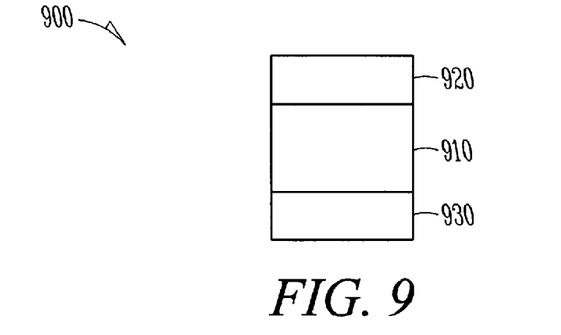
FIG. 9 illustrates a cross-section of an integrated circuit device according to various embodiments.

FIG. 9 illustrates a cross-section of an integrated circuit device 900 according to various embodiments. The device 900 includes a dielectric 910 between a first terminal 920 and a second terminal 930. The dielectric 910 is fabricated according to any of the embodiments described herein. According to various embodiments, the device 900 is a diode or a capacitor.

Figure 10:
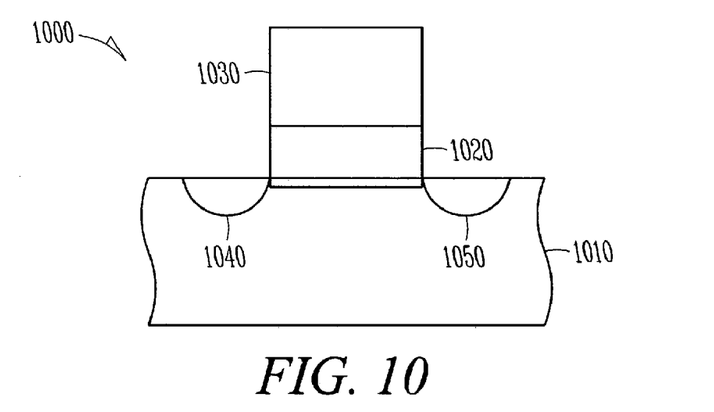
FIG. 10 illustrates a cross-section of a transistor according to various embodiments.

FIG. 10 illustrates a cross-section of a transistor 1000 according to various embodiments. The transistor 1000 includes a substrate 1010, a dielectric 1020 on the substrate 1010, and an electrode 1030 over the dielectric 1020. A source 1040 and a drain 1050 are formed in the substrate 1010. The dielectric 1020 is fabricated according to any of the embodiments described herein.

Figure 11:
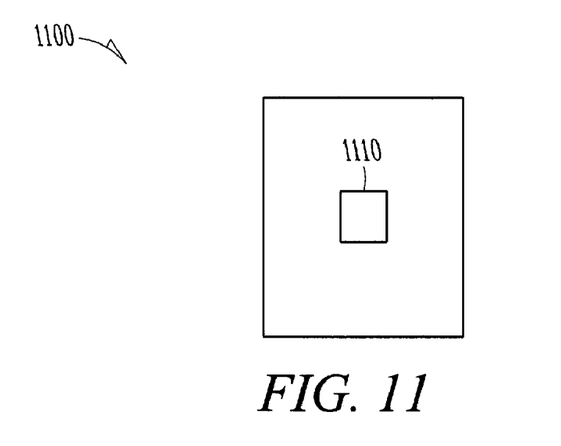
FIG. 11 illustrates a block diagram of an integrated circuit according to various embodiments.

FIG. 11 illustrates a block diagram of an integrated circuit 1100 according to various embodiments. The integrated circuit 1100 includes a device 1110 such as a transistor that includes a dielectric that is fabricated according to any of the embodiments described herein. The device 1110 may also be a diode or a capacitor. According to various embodiments, the integrated circuit 1100 is a microprocessor or a memory.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment.

Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

The invention claimed is:

1. A method comprising:
   forming a second layer over a first layer;
   forming a mask over the second layer;
   patterning the mask to leave a remaining mask over a region of the second layer where an amorphous dielectric material is to be formed;
   removing a portion of the second layer not covered by the mask to expose the first layer;
   removing the mask to expose a remaining second layer;
   forming the amorphous dielectric material on the remaining second layer and not on the exposed first layer; and
   converting the amorphous dielectric material into a crystalline dielectric material.

2. The method of claim 1, further comprising removing free oxygen-hydrogen bonds from a surface of said first layer prior to forming the amorphous dielectric material.

3. The method of claim 1, wherein converting the amorphous dielectric material includes exposing the amorphous dielectric material to a thermal treatment.

4. The method of claim 1, wherein forming the amorphous dielectric material includes forming a high-k dielectric.

5. The method of claim 1, wherein forming a second layer includes forming the second layer including the elements silicon and oxygen.

6. The method of claim 1, wherein forming a second layer includes forming the second layer over a substrate.

7. The method of claim 1, wherein forming the amorphous dielectric material includes forming the amorphous dielectric material by atomic layer deposition.

8. A method comprising:
   forming a silicon dioxide (SiO2) layer over a substrate;
   forming a mask over the silicon dioxide (SiO2) layer;
   removing a portion of the mask to expose a portion of the silicon dioxide (SiO2) layer;

forming an amorphous hafnium oxide material directly on the exposed silicon dioxide (SiO2) layer using atomic layer deposition; and converting the amorphous hafnium oxide material into crystalline hafnium oxide material.

9. The method of claim 8, further comprising removing free oxygen-hydrogen bonds from a surface of said mask before forming the amorphous hafnium oxide material.

10. The method of claim 8, wherein converting the amorphous hafnium oxide material includes a thermal treatment of the amorphous hafnium oxide material.

11. The method of claim 8, wherein forming the silicon dioxide (SiO2) layer directly over the substrate.

12. The method of claim 8, wherein forming an amorphous hafnium oxide material includes forming the amorphous hafnium oxide material by atomic layer deposition.

13. The method of claim 8, wherein forming an amorphous hafnium oxide material includes forming HfSiO2.

14. A method comprising:
forming a mask over a substrate;
removing a portion of the mask over a portion of the substrate;
forming a first layer over the substrate portion where the mask was removed;
forming an amorphous dielectric material over the first layer and not over the remaining mask using atomic layer deposition; and
converting the amorphous dielectric material into a crystalline dielectric material.

15. The method of claim 14, wherein forming a first layer includes forming said first layer including the elements silicon and oxygen.

16. The method of claim 14, further comprising removing free oxygen-hydrogen bonds on a surface of said first layer prior to forming the amorphous dielectric material.

17. The method of claim 14, wherein converting the amorphous dielectric material includes a thermal treatment.

18. The method of claim 14, wherein forming an amorphous dielectric material includes forming the amorphous dielectric material by atomic layer deposition.

19. The method of claim 14, wherein forming an amorphous dielectric material includes forming a high-k material.

20. The method of claim 14, wherein converting the amorphous dielectric material includes converting the amorphous dielectric material into a phase selected from the group consisting of a cubic crystalline phase and a tetragonal crystalline phase.

* * * * *